US008331897B2

(12) United States Patent
Kim et al.

(10) Patent No.: US 8,331,897 B2
(45) Date of Patent: Dec. 11, 2012

(54) HIGHLY LINEAR EMBEDDED FILTERING PASSIVE MIXER

(75) Inventors: Namsoo Kim, San Diego, CA (US); Prasad S. Gudem, San Diego, CA (US); Vladimir Aparin, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 864 days.

(21) Appl. No.: 12/192,933

(22) Filed: Aug. 15, 2008

(65) Prior Publication Data

US 2009/0252252 A1 Oct. 8, 2009

Related U.S. Application Data

(60) Provisional application No. 61/043,015, filed on Apr. 7, 2008.

(51) Int. Cl.
*H04B 1/26* (2006.01)

(52) U.S. Cl. .......... 455/323; 455/333; 455/334

(58) Field of Classification Search .......... 455/313, 455/323, 324, 326, 333, 334, 339, 341
See application file for complete search history.

(56) References Cited

U.S. PATENT DOCUMENTS

| | | | |
|---|---|---|---|
| 7,127,226 B2 | 10/2006 | Tolson | |
| 7,155,179 B1 | 12/2006 | Rothenberg | |
| 7,657,246 B2* | 2/2010 | Shen et al. | 455/318 |
| 2002/0094794 A1 | 7/2002 | Manku et al. | |
| 2004/0176060 A1* | 9/2004 | Hara | 455/190.1 |
| 2005/0176388 A1* | 8/2005 | Yamawaki et al. | 455/126 |
| 2005/0239428 A1 | 10/2005 | Seendripu et al. | |
| 2005/0280467 A1 | 12/2005 | Shi et al. | |
| 2005/0282510 A1* | 12/2005 | Bang et al. | 455/190.1 |
| 2006/0009182 A1* | 1/2006 | Yoneda et al. | 455/234.1 |
| 2006/0154636 A1 | 7/2006 | Shah | |
| 2007/0014229 A1 | 1/2007 | Hepler | |
| 2007/0030076 A1 | 2/2007 | Kim | |
| 2007/0110171 A1* | 5/2007 | Iida | 375/260 |

(Continued)

FOREIGN PATENT DOCUMENTS

EP   1855378 A1   11/2007

(Continued)

OTHER PUBLICATIONS

International Search Report & Written Opinion—PCT/US2009/039821, International Search Authority—European Patent Office—Aug. 19, 2009.

(Continued)

*Primary Examiner* — Nhan Le
(74) *Attorney, Agent, or Firm* — Jonathan T. Velasco; Eric Ho

(57) ABSTRACT

A communication channel has a highly linear switched current mixer that incorporates passive filtering (e.g., low pass, notch) for improved transmitting (Tx) and receiving (Rx) with adding external filtering components. A high $IIP_2$ (input referenced second order intercept point) of the receiver at the Tx offset is essential to avoid corrupting the system's sensitivity performance, and a high triple beat (TB) is required to avoid sensitivity degradation due to transmitter leakage. Thanks to the embedded filtering in the mixer and the active post-distortion (APD) method in a low noise amplifier (LNA), the required high linearity is achieved with low noise figure and power consumption, overcoming transmitter power leakage without the use of a SAW (surface acoustic wave) filter.

28 Claims, 10 Drawing Sheets

U.S. PATENT DOCUMENTS

| | | | |
|---|---|---|---|
| 2007/0132889 A1 | 6/2007 | Pan | |
| 2007/0229154 A1 | 10/2007 | Kim | |
| 2007/0275684 A1* | 11/2007 | Harada et al. | 455/185.1 |
| 2007/0277876 A1 | 12/2007 | Huang | |
| 2008/0112519 A1* | 5/2008 | Jung et al. | 375/350 |
| 2008/0139123 A1* | 6/2008 | Lee et al. | 455/63.1 |

FOREIGN PATENT DOCUMENTS

| | | |
|---|---|---|
| JP | 11055039 A | 2/1999 |
| JP | 2002280924 A | 9/2002 |
| JP | 2005244397 A | 9/2005 |
| JP | 2006295296 A | 10/2006 |
| JP | 2007028303 A | 2/2007 |
| JP | 2007533273 A | 11/2007 |
| TW | 508901 B | 11/2002 |
| WO | WO0117122 A1 | 3/2001 |
| WO | WO2005101648 A1 | 10/2005 |
| WO | WO2007016552 | 2/2007 |

OTHER PUBLICATIONS

Muhammad K et al: "Direct RF sampling mixer with recursive filtering in charge domain" Circuits and Systems, 2004. ISCAS 04. Proceedings of the 2004 Interna Tignal Symposium on Vancouver, BC, Canada May 23-26, 2004, Piscataway, NJ, USA,IEEE, US, May 23, 2004, pp. I-577-1-580, XP010719181 ISBN: 978-0-7803-8251-0 section 1 figure 1.

Stanic N et al: "A 0.5 V Receiver in 90 nm CMOS for 2.4 GHz Applications" Radio Frequency Integrated Circuits (RFIC) Symposium, 2007 IEEE, IEEE, Piscataway, NJ, USA, Jun. 1, 2007, pp. 109-112, XP031112991 ISBN: 978-1-4244-0530-5 abstract figure 2 section II. "RF Section Blocks".

Yong et al., "Analysis and design of CMOS RF integrated circuits", 1900, Tsinghua University Press, ISBN: 7-302-13759-5, Jan. 2006.

* cited by examiner

HIGHLY LINEAR EMBEDDED FILTERING PASSIVE MIXER

CLAIM OF PRIORITY UNDER 35 U.S.C. §119

The present Application for Patent claims priority to Provisional Application No. 61/043,015 entitled "A Highly Linear Embedded Filtering Passive Mixer" filed Apr. 7, 2008, and assigned to the assignee hereof and hereby expressly incorporated by reference herein.

FIELD OF INVENTION

The present disclosure relates generally to circuits, and more specifically to an amplifier suitable for wireless communication and other applications.

BACKGROUND

Zero-IF (intermediate frequency) radio frequency (RF) front-end architectures are attractive for cellular systems due to lower cost and Bill-of-Material (BOM). A direct-conversion receiver (DCR), also known as homodyne, synchrodyne, or zero-IF receiver, is a radio receiver design that demodulates incoming signals by mixing it with a local oscillator signal synchronized in frequency to the carrier of the wanted signal. The wanted demodulated signal is thus obtained immediately by low-pass filtering the mixer output, without requiring further detection. The receiver has the advantage of high selectivity, and is inherently a precision demodulator.

However, an external SAW (surface acoustic wave) filter after the Low Noise Amplifier (LNA) stage has been an essential component of cellular systems for several reasons. The two main reasons for using an external SAW filter in full duplex communication systems, like CDMA and WCDMA, are Triple Beat (TB) and $IIP_2$ performance requirements at the transmit (Tx) offset. ($IIP_2$ is the theoretical input level at which the second-order two-tone distortion products are equal in power to the desired signals.) The calculation is based on the following equation: Tx power can leak to the LNA despite the duplexer isolation between the receive (Rx) and transmit (Tx) band. The typical duplexer isolation is 55 dB in the CDMA Cellular band, and the maximum Tx power can be as high as +27 dBm, resulting in −28 dBm of Tx power at the Rx input port. This strong Tx power can cause well-known cross-modulation distortion (XMD).

This distortion problem is usually dominated by the LNA performance, because Tx rejection by an external SAW filter reduces the mixer TB requirement. More importantly, the reduced Tx power at the mixer input reduces the $IIP_2$ performance concern at the Tx offset frequency, since the second-order distortion at the Tx frequency offset can increase the noise floor of the receiver in a Zero-IF system.

A SAW-less receiver system is desirable since it eliminates the SAW filter as well as the external matching components. There have been several efforts to implement a SAW-less CDMA receiver. A Tx canceller used an LMS (least mean squares) adaptive filter requiring up/down conversion mixers and a low-pass filter in the loop. This method suffers from several performance problems. First, the noise figure (NF) of the receiver is degraded due to the operation of the LMS loop. Second, the rejection varies depending on the group delay of the external matching network. Third, the TB performance of the overall system can be degraded due to the LMS loop.

An on-chip Tx reject band-pass filter using bond-wire inductors for a WCDMA system has been reported. This method has benefits of saving area compare to an on-chip inductor and increasing the selectivity of filter due to high-Q of bond-wire. But this method may have limited feasibility in real production due to bond wire variations.

SUMMARY

The following presents a simplified summary in order to provide a basic understanding of some aspects of the disclosed aspects. This summary is not an extensive overview and is intended to neither identify key or critical elements nor delineate the scope of such aspects. Its purpose is to present some concepts of the described features in a simplified form as a prelude to the more detailed description that is presented later.

In accordance with one or more aspects and corresponding disclosure thereof, various aspects are described in connection with a mixer having integral passive low pass filtering circuitry for reducing transmitter leakage interference in receiver applications and for inherently serving as a notch filter for noise reduction in transmitter applications, such as in wireless communication devices. Obviating the need for active external components, such as a SAW (surface acoustic wave) filter provides for a more economical device with reduced power consumption. This approach also avoids using large external passive components that can increase device size and reduce semiconductor wafer yield.

In one aspect, an integrated circuit is provided for highly linear mixing of a radio frequency (RF) signal in a mixer circuitry. The mixer circuitry comprises a first switching stage for frequency converting an RF signal switched by a local oscillator. Passive filter circuitry is electrically connected to output of the first stage to advantageously filter after frequency conversion by the first switching stage. A second switching stage, which is switched by the local oscillator, is electrically connected to the output of the passive filter circuitry to convert charge into a current signal for subsequent amplification.

In another aspect, a method is provided for highly linear mixing of a radio frequency (RF) signal. An RF signal is received at an integrated circuit mixer. A first switching stage is locally oscillated to perform frequency conversion of the RF signal. The frequency converted signal is passed through an integral passive filter to suppress a noise component. The passively filtered signal is passed through a locally oscillated second switching stage to output a mixed signal.

In a further aspect, an apparatus performs highly linear mixing of a radio frequency (RF) signal. Means are provided for receiving an RF signal at an integrated circuit mixer. Means are provided for locally oscillating a first switching stage to perform frequency conversion of the RF signal. Means are provided for passing the frequency converted signal through an integral passive filter to suppress a noise component. Means are provided for passing the passively filtered signal through a locally oscillated second switching stage to output a mixed signal.

To the accomplishment of the foregoing and related ends, one or more aspects comprise the features hereinafter fully described and particularly pointed out in the claims. The following description and the annexed drawings set forth in detail certain illustrative aspects and are indicative of but a few of the various ways in which the principles of the aspects may be employed. Other advantages and novel features will become apparent from the following detailed description when considered in conjunction with the drawings and the disclosed aspects are intended to include all such aspects and their equivalents.

BRIEF DESCRIPTION OF THE DRAWINGS

The features, nature, and advantages of the present disclosure will become more apparent from the detailed description set forth below when taken in conjunction with the drawings in which like reference characters identify correspondingly throughout and wherein.

DETAILED DESCRIPTION

Figure 1:
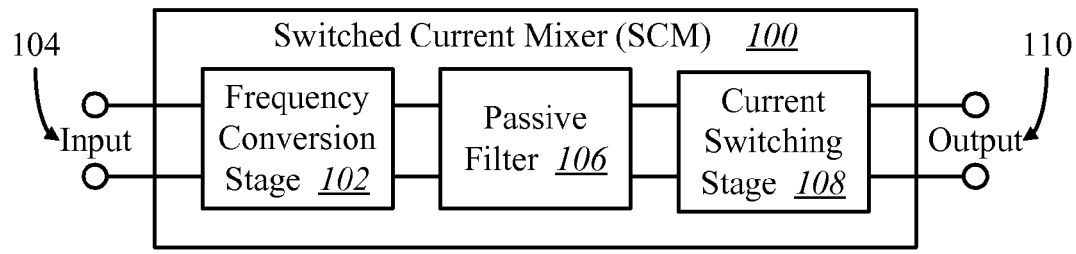
FIG. 1 illustrates a block diagram of a switched current mixer with embedded passive filtering for a communication system.

A communication channel has a highly linear switched current mixer that incorporates embedded passive filtering (e.g., low pass, notch) for improved transmitting (Tx) and receiving (Rx) without requiring an external surface acoustic wave (SAW) filtering components for Tx leakage/noise suppression. A high $IIP_2$ (input referenced second order intercept point) of the receiver at the Tx offset is essential to avoid corrupting the system's sensitivity performance, and a high triple beat (TB) is required to avoid sensitivity degradation due to transmitter leakage. Thanks to the embedded filtering in the mixer and the active post-distortion (APD) method in a low noise amplifier (LNA), the required high linearity is achieved with low noise figure and power consumption, overcoming transmitter power leakage without the use of a SAW (surface acoustic wave) filter. An illustrative receiver integrated circuit (IC) exhibits more than +60 dBm of Rx $IIP_2$, 2.4 dB Rx noise figure (NF), and +77 dB of Triple Beat (TB) with 45 MHz transmit leakage at 900 MHz Rx frequency while consuming only 18 mA from a 2.1V supply. In another implementation, RF tuners, such as tunable tracking filters used in broadband receivers such as television and cable tuners can benefit from a switch current mixer with embedded passive filtering. Thereby, noise from adjacent channels can be rejected with a more economical tuner. As an additional application, with embedded passive filtering as a notch filter at an offset Rx band, the switched current mixer can advantageously benefit a Tx channel, avoiding the need for an external SAW filter as well.

Various aspects are now described with reference to the drawings. In the following description, for purposes of explanation, numerous specific details are set forth in order to provide a thorough understanding of one or more aspects. It may be evident, however, that the various aspects may be practiced without these specific details. In other instances, well-known structures and devices are shown in block diagram form in order to facilitate describing these aspects.

As used in this application, the terms "component", "module", "system", and the like are intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a server and the server can be a component. One or more components may reside within a process and/or thread of execution and a component may be localized on one computer and/or distributed between two or more computers.

The word "exemplary" is used herein to mean serving as an example, instance, or illustration. Any aspect or design described herein as "exemplary" is not necessarily to be construed as preferred or advantageous over other aspects or designs.

Furthermore, the one or more versions may be implemented as a method, apparatus, or article of manufacture using standard programming and/or engineering techniques to produce software, firmware, hardware, or any combination thereof to control a computer to implement the disclosed aspects. The term "article of manufacture" (or alternatively, "computer program product") as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope of the disclosed aspects.

Various aspects will be presented in terms of systems that may include a number of components, modules, and the like. It is to be understood and appreciated that the various systems may include additional components, modules, etc. and/or may not include all of the components, modules, etc. discussed in connection with the figures. A combination of these approaches may also be used. The various aspects disclosed herein can be performed on electrical devices including devices that utilize touch screen display technologies and/or mouse-and-keyboard type interfaces. Examples of such devices include computers (desktop and mobile), smart phones, personal digital assistants (PDAs), and other electronic devices both wired and wireless.

Turning to the Drawings, in FIG. 1, a switched current mixer (SCM) 100 has a frequency conversion stage 102 that receives an RF input 104. The output of the frequency conversion stage 102 is filtered (e.g., low pass for a receiver channel application, Rx band notch filtered for a transmitter channel application) by an embedded passive filter 106. The charge from the passive filter 106 passes through a current switching stage 108 as an output 110 to create a current for further amplification that does not require a SAW filter. Thereby, highly linear mixing is achieved with embedded passive filtering (i.e., frequency conversion is combined with filtering). This approach places less burden on a following stage due to reduced current at high frequency.

Figure 2:
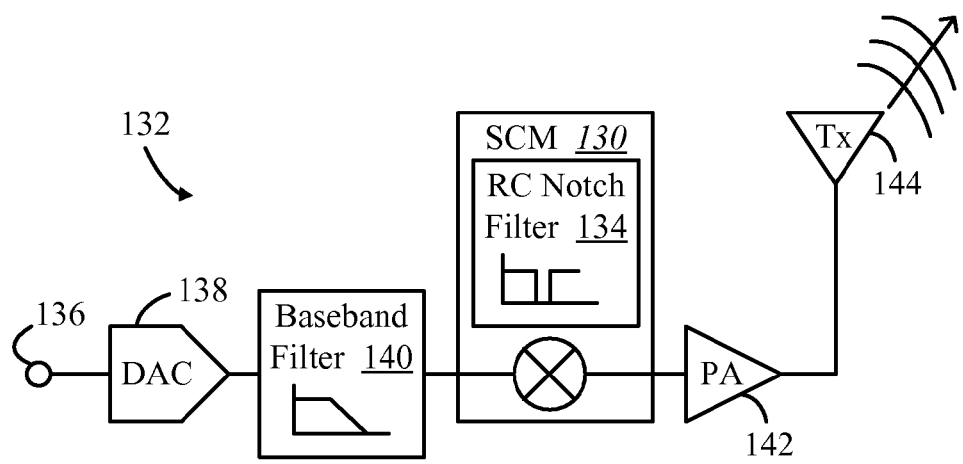
FIG. 2 illustrates a block diagram of a transmission channel incorporating a switched current mixer having integral passive notch filtering for noise suppression.

For example, in FIG. 2, an application for a SCM 130 is depicted for a transmitter (Tx) channel 132. In this instance, a passive notch filter 134 embedded in the SCM 130 can reduce RX band noise for reducing Tx leakage to a simultaneous FDMA Tx/Rx system (e.g., CDMA, WCDMA, OFDMA, LTE, UMB). Such noise suppression is advantageous also to avoid jamming another FDMA device or those employing TDMA (e.g., GSM). The illustrative Tx channel 132 is depicted as an input 136 that passes through a digital-to-analog converter (DAC) 138 and through a baseband filter 140 to remove high frequency noise. After mixing in SCM 130, further amplification can follow, depicted as a power amplifier (PA) 142 that prepares the signal for transmission by a Tx antenna 144. The embedded filtering by the SCM 130 benefits a PA 142 such as a time impedance amplifier (TIA). A nonlinearity of a time impedance amplifier (TIA) due to high Tx is obviated. This performance is helpful for Tx TIP$_2$ and TB performance. Another example of a PA 142 is a common gate amplifier (CGA) that also benefits from the embedded filtering of the SCM 130.

Figure 3:
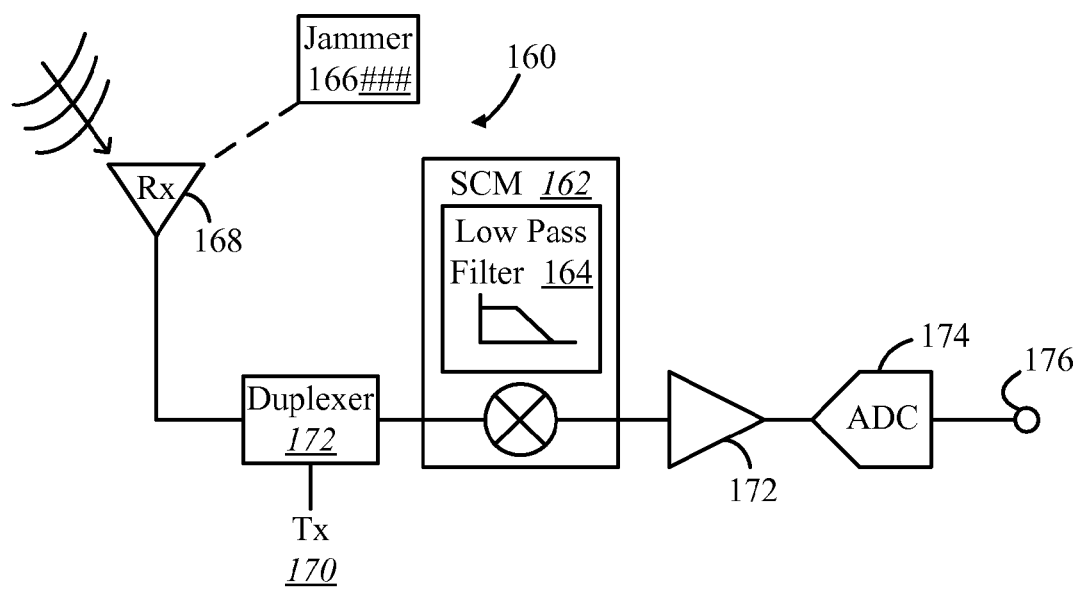
FIG. 3 illustrates a block diagram of a receiver channel incorporating a switched current mixer having integral passive transmitter leakage filtering.

In FIG. 3, a receiver (Rx) channel 160 can benefit by use of a SCM 162 having an embedded low pass filter 164. For example, Tx rejection from a jammer source 166 received at an Rx antenna 168 can be achieved. In addition, Tx leakage from a Tx channel 170 from a duplexer 172 that also utilizes the antenna 168 can be filtered. Thereby, the remaining components of the Rx channel 160 are reduced, as depicted as an amplifier 172 for biasing a signal for full utilization of an analog-to-digital converter (ADC) 174 for an output 176. The embedded filtering receiver is introduced to the mixer 130, rather than requiring a SAW filter. The system obtains an additional 15 dB of Tx rejection; it shows more than +60 dBm of receiver IIP$_2$ at Tx offset and +77 dB TB. The double side band (DSB) NF is 2.4 dB and the total current consumption is 18 mA from 2.1V supply.

Furthermore, the techniques described herein may be used for various wireless communication systems such as CDMA, TDMA, FDMA, OFDMA, SC-FDMA and other systems. The terms "system" and "network" are often used interchangeably. A CDMA system may implement a radio technology such as Universal Terrestrial Radio Access (UTRA), cdma2000, etc. UTRA includes Wideband-CDMA (W-CDMA) and other variants of CDMA. CDMA2000 covers IS-2000, IS-95 and IS-856 standards. A TDMA system may implement a radio technology such as Global System for Mobile Communications (GSM). An OFDMA system may implement a radio technology such as Evolved UTRA (E-UTRA), Ultra Mobile Broadband (UMB), IEEE 802.11 (Wi-Fi), IEEE 802.16 (WiMAX), IEEE 802.20, Flash-OFDM®, etc. UTRA and E-UTRA are part of Universal Mobile Telecommunication System (UMTS). 3GPP Long Term Evolution (LTE) is an upcoming release of UMTS that uses E-UTRA, which employs OFDMA on the downlink and SC-FDMA on the uplink. UTRA, E-UTRA, UMTS, LTE and GSM are described in documents from an organization named "3rd Generation Partnership Project" (3GPP). CDMA2000 and UMB are described in documents from an organization named "3rd Generation Partnership Project 2" (3GPP2). These various radio technologies and standards are known in the art.

Figure 4:
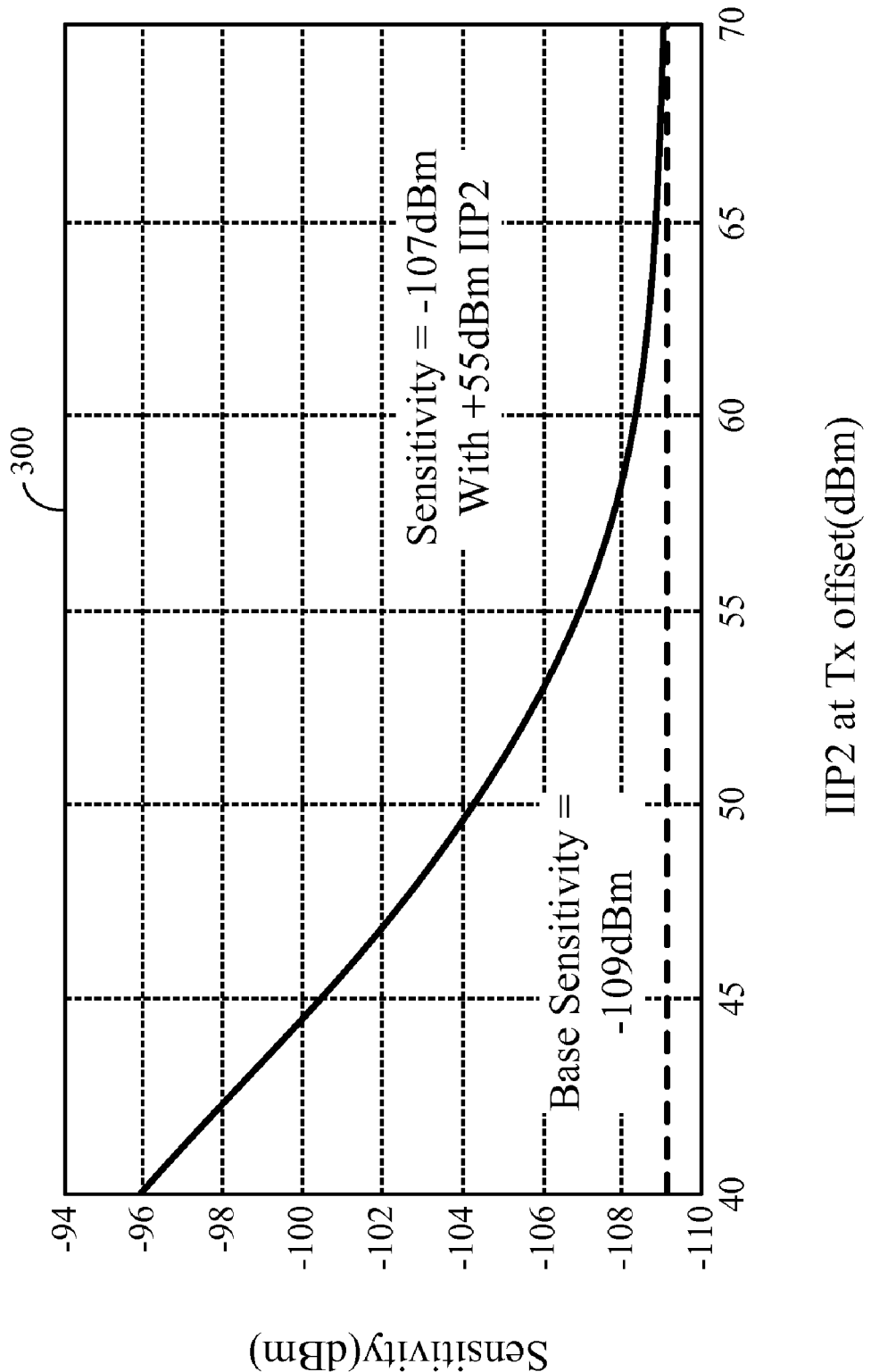
FIG. 4 illustrates a plot of $IIP_2$ performance versus sensitivity.

In an illustrative sensitivity specification for SAW-less Rx in a CDMA communication system, the IIP$_2$ performance at the Tx frequency offset degrades the NF and sensitivity. The tradeoff between IIP$_2$ and sensitivity with −28 dBm of Tx leakage power is illustrated in FIG. 4. The relationship can be defined a $$\text{Sensitivity}=10\cdot\log_{10}[10^{IM2,Tx/10}+\kappa\cdot T\cdot B\cdot 10^3\cdot 10^{NF_{ant}/10}] \qquad \text{Eqn. (1)}$$
$$\text{CNR}$$

where, $\kappa$ is Boltzmann's Constant, T is absolute temperature, B is signal bandwidth (1.23 MHz in CDMA), CNR is Carrier to Noise Ratio, $NF_{ant}$ is the noise figure referred to the antenna, and $IM_2$,Tx is Tx $IM_2$ power in the Rx band. As can be seen as depicted at 300 in FIG. 4, the sensitivity is highly dependent on the Tx IIP$_2$ performance, and a +55 dBm Tx IIP$_2$ is required for a 2 dB sensitivity degradation. A +55 dBm receiver IIP2—without some form of Tx rejection—is extremely challenging due to the high LNA gain at the Tx frequency.

When the Tx power leaks to the Rx port and a jammer is present in the vicinity of the Rx band, cross-modulation distortion (XMD) becomes the key determiner of the linearity and phase noise requirements of the receiver. The receiver needs to have +8 dBm of effective IIP$_3$ to avoid corrupting the single tone de-sense (STD) test defined in the CDMA standard.

A third-order intercept point (IP$_3$ or TOI) is a measure for weakly nonlinear systems and devices, for example receivers, linear amplifiers and mixers. It is based on the idea that the device nonlinearity can be modeled using a low order polynomial, derived by means of Taylor series expansion. The third-order intercept point relates nonlinear products caused by the 3rd order term in the nonlinearity to the linearly amplified signal.

Figure 5:
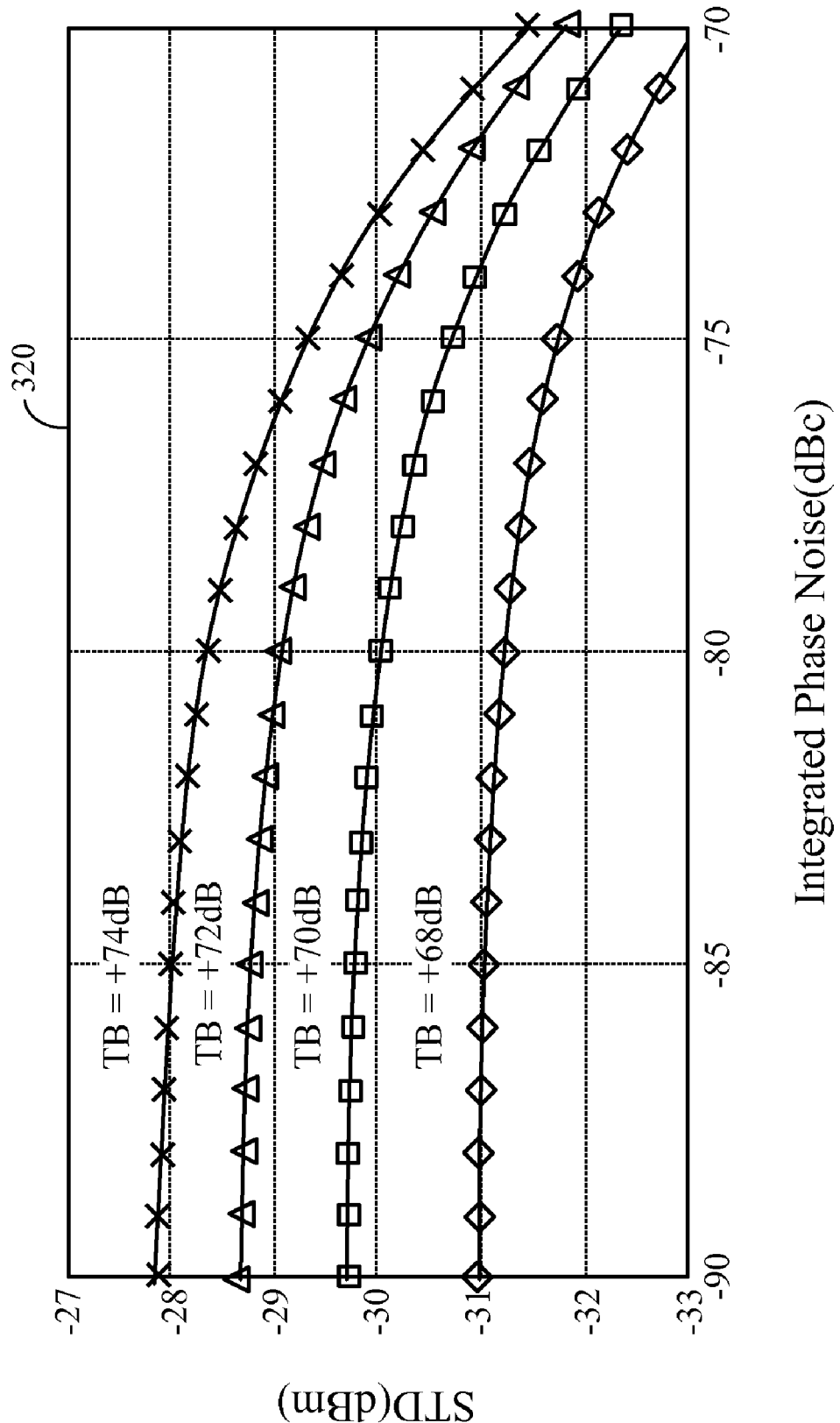
FIG. 5 illustrates a plot of trade-off between phase noise and Triple Beat (TB) performance.

With a SAW filter between the LNA and mixer, the STD mainly depends on the linearity of the LNA, since the SAW filter will reject the Tx leakage by 35 dB. On the other hand, a SAW-less receiver places an additional linearity burden on the mixer and the following stages. In addition, the phase noise requirement of the VCO at the jammer offset becomes extraordinarily difficult to meet because of reciprocal mixing. A receiver STD performance can be expressed $$N_j=10\cdot\log_{10}[10^{(P_j-TB)/10}+10^{(P_j+P_{phase})/10}+ \kappa\cdot T\ B\cdot 10^3\cdot 10^{NF_{ant}/10}] \qquad \text{Eqn. (2)}$$

where, $P_j$ is jammer power at antenna (in dBm) and $P_{phase}$ is phase noise integrated over signal bandwidth with the center frequency at jammer offset (in dBm). The trade-off between phase noise and TB performance is depicted at 320 in FIG. 5. It shows the phase noise requirement for −30 dBm STD with various TB performances. The STD performance can never meet −30 dBm if the TB is +68 dB, but the phase noise can be relaxed to approximately −75 dBc with +72 dB of TB.

Figure 6:
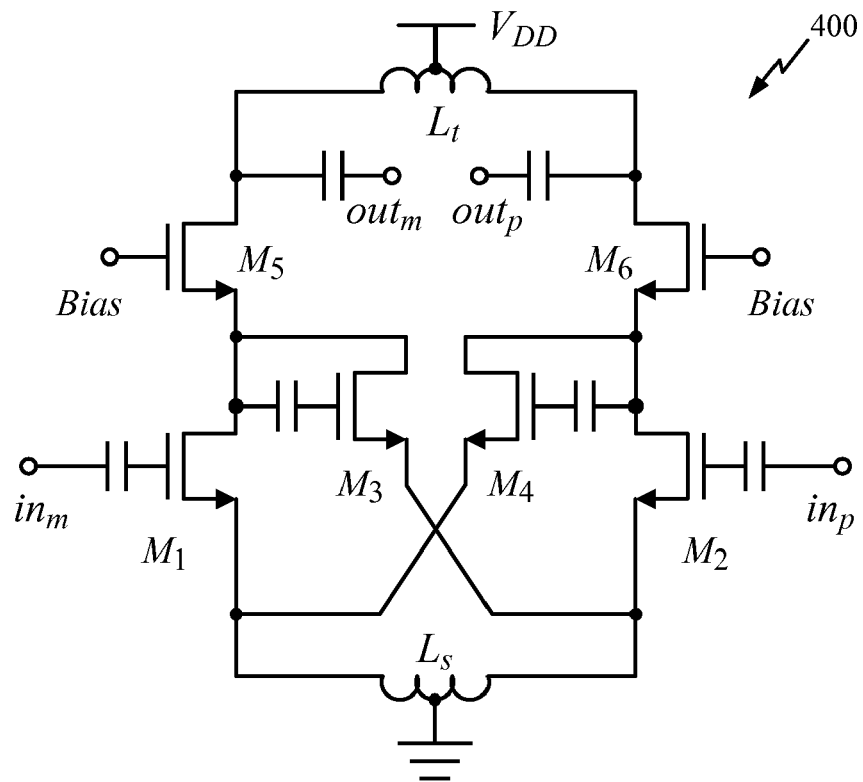
FIG. 6 illustrates a schematic of differential active post-distortion method (APD) LNA.

Due to the high IIP$_3$ requirement of the LNA, the conventional source degenerated LNA is not suitable. There are various ways of designing a highly linear LNA, such as the modified derivative super-position method (MDS) and the active post-distortion method (APD). In this design, the APD method is chosen. Using this method, the complexity of the bias circuitry and the related input parasitic capacitance can be reduced. The simplified schematic of a CMOS LNA 400 is shown in FIG. 6. M1, M2, M5, and M6 form the main signal path while M3 and M4 act as IM$_3$ cancellers.

The LNA 400 adopts a differential architecture. A differential LNA 400 provides several advantages compared to its single-end counterpart. First, there is no need of an active or passive balun to connect the doubly balanced mixer after the LNA. An active balun will cause additional current consumption and linearity degradation and a passive balun will create area and noise figure penalties due to the passive circuit losses. The differential design has more external input matching components, but the overall reduction of external components is still significant.

It should be appreciated with the benefit of the present disclosure that in a SAW-less receiver, the mixer with embedded passive filtering can contribute to the linearity performance of the receiver. The mixer is based on a doubly balanced passive approach. A passive mixer gives better linearity and NF performance, especially in narrow-band communication systems. The flicker noise (1/f) of the mixer can corrupt integrated noise, but the passive mixer will not introduce significant flicker noise, since there is no dc current.

The impedance seen at the LNA output is quite high, due to the relatively high impedance of the inductor at the LNA output. The low impedance of the mixer input ensures that the RF current flows to the mixer input with minimal loss. The $IM_2$ component generated in the LNA can be blocked by a coupling capacitor between the LNA output and the mixer input. Hence, there will be almost no voltage signal swing at the LNA output due to the low impedance provided by the mixer. The nonlinearity of the mixer plays a role after the Tx signal is down-converted.

Figure 7:
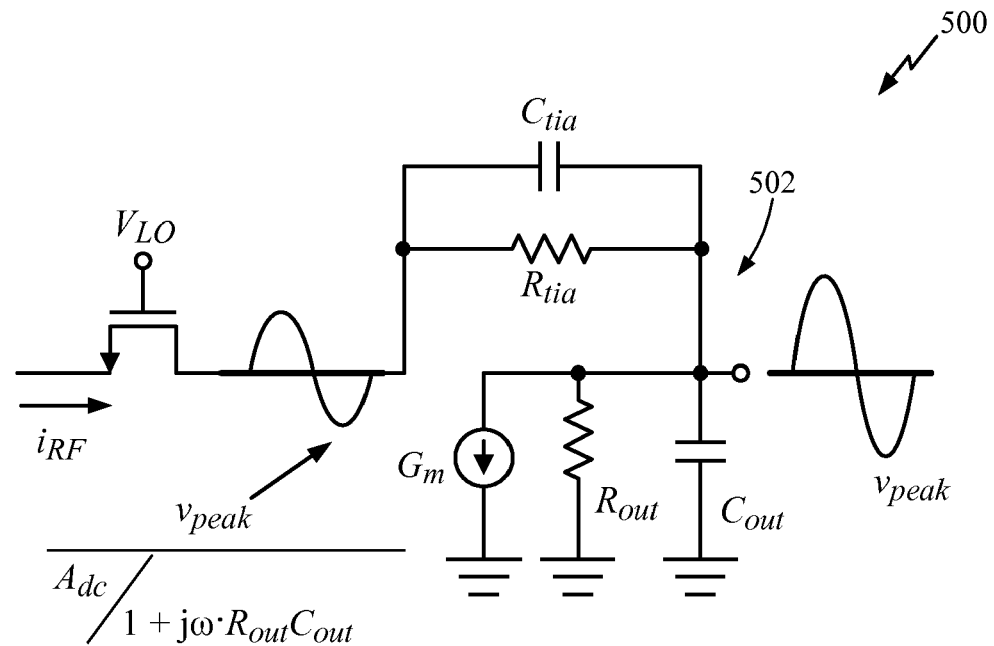
FIG. 7 illustrates a problem of using a conventional passive mixer with a large transmitter (Tx) leakage signal.

The problem of using a conventional passive mixer 500 with a transimpedance amplifier (TIA) 502 at the output is illustrated in FIG. 7. The finite opamp gain-bandwidth causes a large signal swing at the TIA input and introduces nonlinearity from both the Mixer and TIA 502. Even if the TIA 502 has a high gain-bandwidth product, it has to provide tremendous current into $C_{tia}$ to avoid introducing nonlinearity caused by incomplete capacitor charging.

Figure 8:
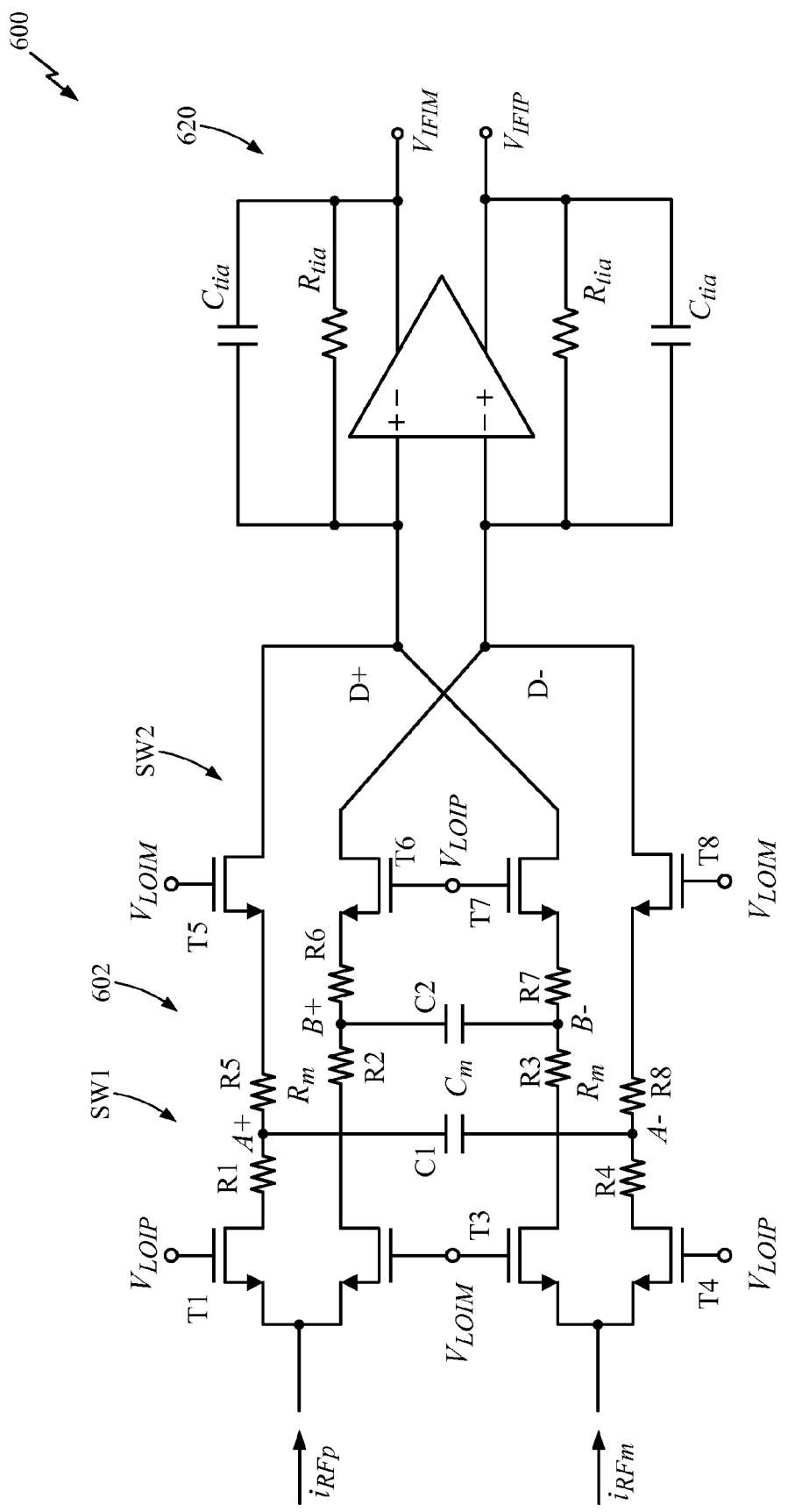
FIG. 8 illustrates a simplified schematic of embedded filtering passive mixer.

The simplified schematic of an illustrative embedded filtering passive Mixer (EFP Mixer), which avoids this problem, is depicted at 600 in FIG. 8. The EFP Mixer 600 has two switches SW1, SW2 connected in series, and each switch SW1, SW2 is controlled by opposite phases of the local oscillator (LO) signal ($V_{LOIP}$-$V_{LOIM}$). The first switch SW1 comprises an n-type CMOS transistor T1 whose base receives LO signal $V_{LOIP}$, whose emitter receives current reference $i_{RFp}$, and whose collector is connected to a first end of a resistor R1 of an embedded passive filter circuitry 602. The other end of the resistor R1 is connected to node A+. A second transistor T2 has a base biased by $V_{LOIP}$, an emitter connected to the emitter of transistor T1 and current reference $i_{RFp}$, and whose collector is connected to a first end of a resistor R2 having resistance Rm of the embedded passive filter circuitry 602, with the other end of resistor R2 connected to a positive Cm node B+. (Each resistor discussed below for passive filter circuitry 602 has a resistance Rm.) The first switch SW1 further comprises a third transistor T3 whose base receives LO signal $V_{LOIM}$, whose emitter receives current reference $i_{RFm}$, and whose collector is connected to a first end of a resistor R3 of the embedded passive filter circuitry 602. The other end of the resistor R3 is connected to node connected to a negative Cm node B−. A fourth transistor T4 has a base biased by $V_{LOIP}$, an emitter connected to the emitter of transistor T3 and current reference $i_{RFm}$, and whose collector is connected to a first end of a resistor R4 of the embedded passive filter circuitry 602, with the other end of resistor R4 connected to a node A−. A first capacitor C1 is connected across nodes A+, A−. A second capacitor C2 is connected across nodes C+, C−. Both capacitors C1, C2 have a capacitance of Cm.

The second switch SW2 has a fifth transistor T5 whose base is biased by $V_{LOIM}$, whose emitter is connected to a first side of a fifth resistor R5 of the embedded passive filter circuitry 602 whose other end is connected to node A+, and whose collector is connected to positive intermediate output node D+. A sixth transistor T6 has a base biased by $V_{LOIP}$, an emitter connected to one end of a sixth resistor R6 of the passive filter circuitry 602 whose other end connects to node C+, and whose collector connects to an output node D−. A seventh transistor T7 has a base biased by $V_{LOIP}$, an emitter connector to one end of a seventh resistor R7 of the passive filter circuitry 602 whose other end is connected to node C−, and whose collector connects to node D+. An eighth transistor T8 has a base biased by $V_{LOIM}$, whose emitter is connected to one end of an eighth resistor R8 of the passive filter circuitry 602 whose other end is connected to node A−, and whose collector is connected to node D−.

In between the switches SW1, SW2 is the embedded passive filter 602, which is a series RC filter in the illustrative implementation, which determines the bandwidth of the filtering. The RF current $i_{RFp}$, $i_{RFm}$, flows into the first set of switches SW1, and is down-converted as a nominal passive mixer. The current at node A and the voltage across $C_m$, when the positive LO signal ($V_{LOIP}$) is high, can be expressed by $$i_A(t) \approx g_{m,LNA} \cdot A_{rf} \cdot e^{-1/\tau \cdot 2 f_{LO}} \cdot \left[ \cos(\omega_{rf} t) + \frac{2}{3\pi} \cdot \cos(2\omega_{rf} t) - \frac{2}{15\pi} \cdot \cos(4\omega_{rf} t) \ldots \right] \cdot LO(t) \quad \text{Eqn. (3)}$$

$$v_{C_m} = \frac{1}{C_m} \cdot \int i_A(t) dt \cdot [1 + (f_{offset}/f_{3dB})^2]^{-\frac{1}{2}} \quad \text{Eqn. (4)}$$

where, $\tau = R_m C_m$, $f_{3\ dB} = (2\pi\tau)^{-1}$, $A_{rf}$ is amplitude of RF input voltage, and $g_{m,LNA}$ is the transconductance of the LNA. This voltage generates a current into a transimpedance amplifier 620, inversely proportional to $R_m$, when the negative LO signal ($V_{LOIM}$) is high, and the integration in Eqn. (4) provides a low-pass filtering action.

Figure 9:
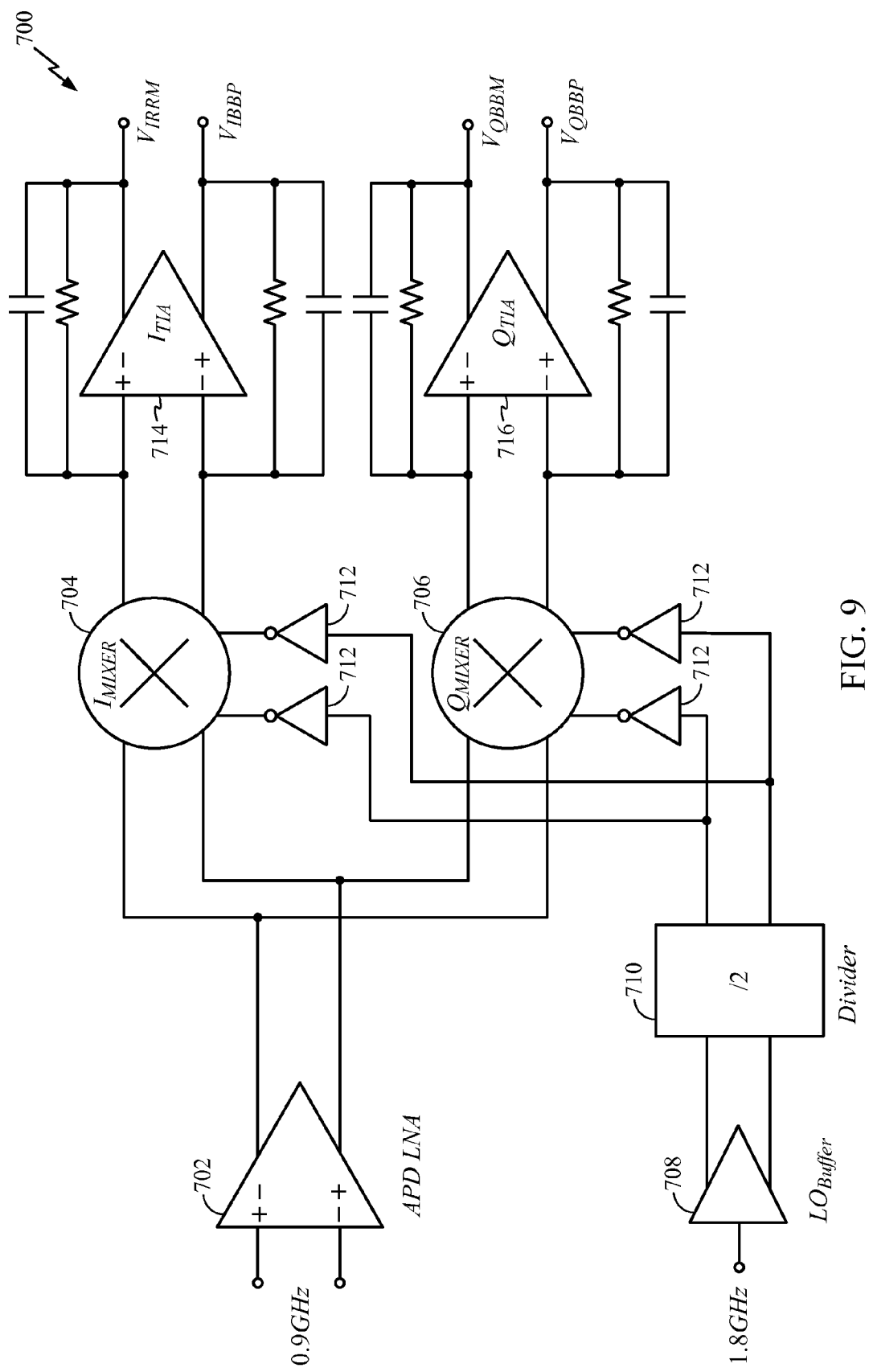
FIG. 9 illustrates a block diagram of embedded filtering SAW-less receiver.

The block diagram of a receiver 700 is shown in FIG. 9 It consists of a differential APD LNA 702 whose outputs pass both to a passive I mixer 704 and a passive Q mixer 706, both having embedded filtering. Switching of the mixers 704, 706 is supported by an LO buffer 708 whose differential outputs pass through a divider 710 to the mixers 704, 706 via respective inverters 712. The outputs of the I mixer 704 pass through a TIA 714 and the outputs of the Q mixer 706 pass through a TIA 716.

Figure 10:
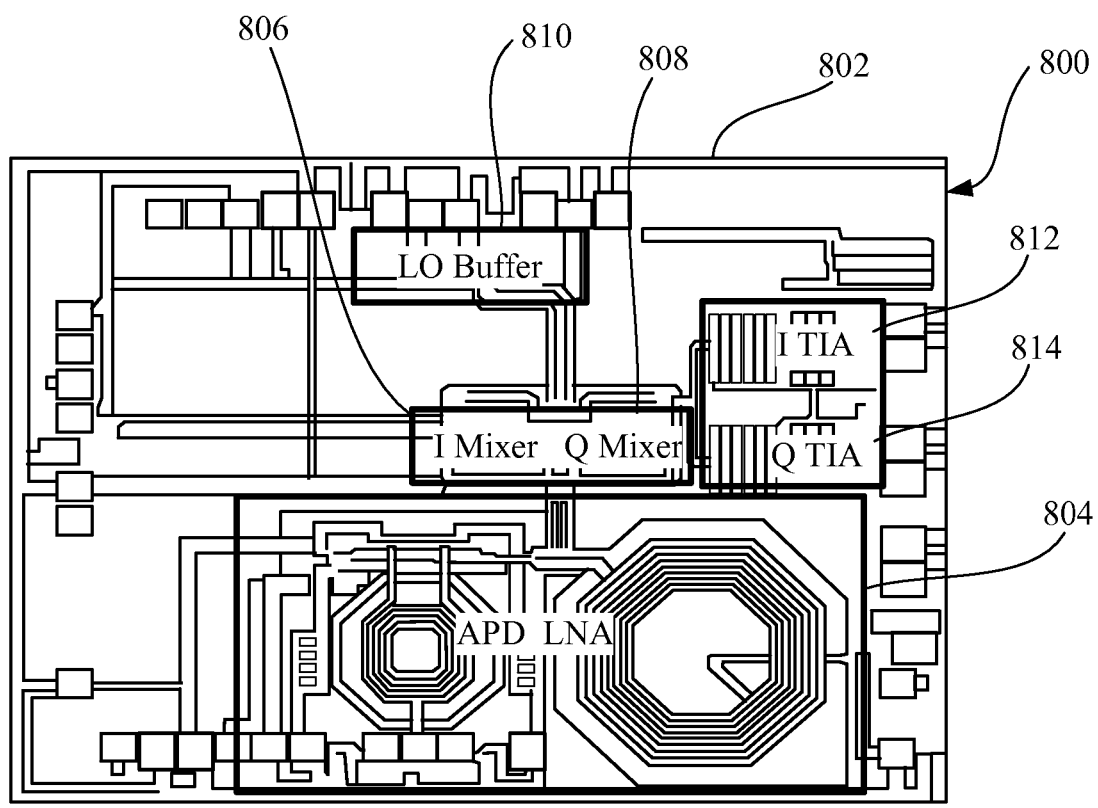
FIG. 10 illustrates a photograph of an embedded filtering receiver.

In FIG. 10, a die 800 implementing an integrated circuit receiver 802 consists of a differential APD LNA 804, embedded filtering passive I-Mixer 806 and Q-Mixer 808, TIA 806, LO buffer 810, I TIA 812 and Q TIA 814. The conventional passive mixer version (not shown) of the receiver (FIG. 7) was fabricated at the same time, in order to have a comparison with the EFP mixer 600 (FIG. 8).

Figure 11:
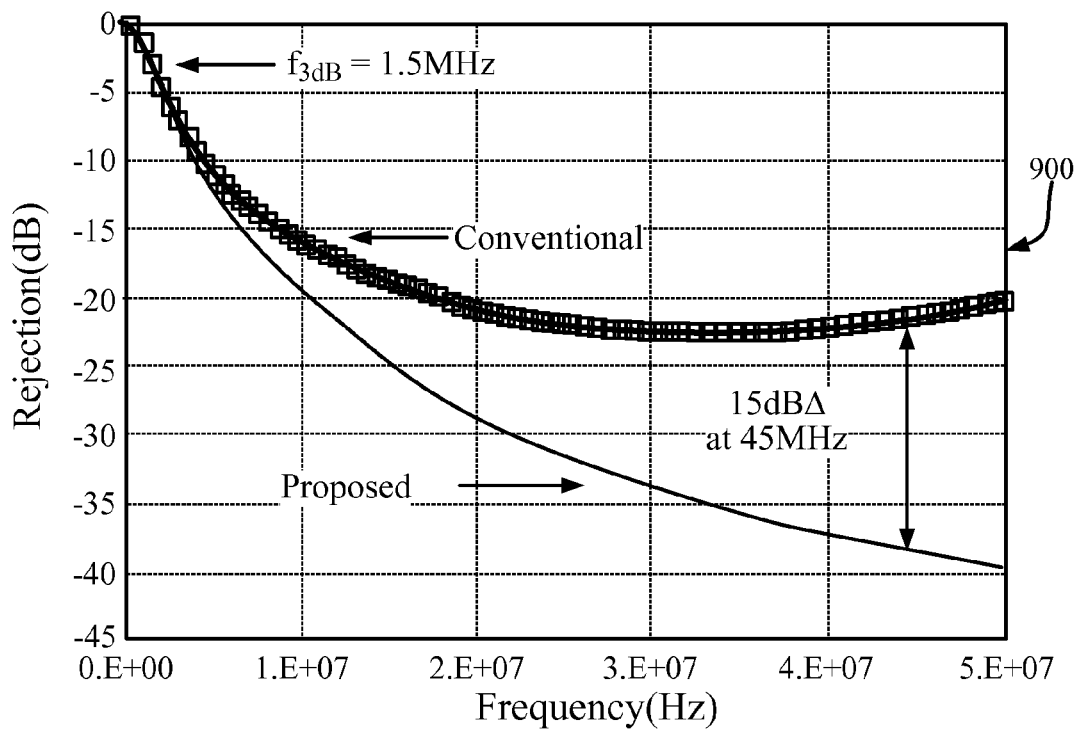
FIG. 11 illustrates a plot of measured frequency response comparison.

The measured frequency responses for both receivers with the differing mixers are shown in FIG. 11. The gain is measured with a 150 kHz in-band tone and the EFP mixer has 42 dB gain and the conventional one has 44 dB gain. The rejection is normalized since there is 2 dB of gain difference. The TIA provides 1.5 MHz of 3 dB cutoff frequency and the EFP mixer is designed to have an additional pole at 10 MHz. As can be seen, the proposed Mixer has 15 dB more rejection at 45 MHz offset, which is the Tx offset frequency in the CDMA CELL band. The performance of the conventional design illustrates the mixer limitation issue mentioned above. Due to the finite opamp gain-bandwidth, the TIA cannot provide sufficient rejection at a high frequency offset.

Figure 12:
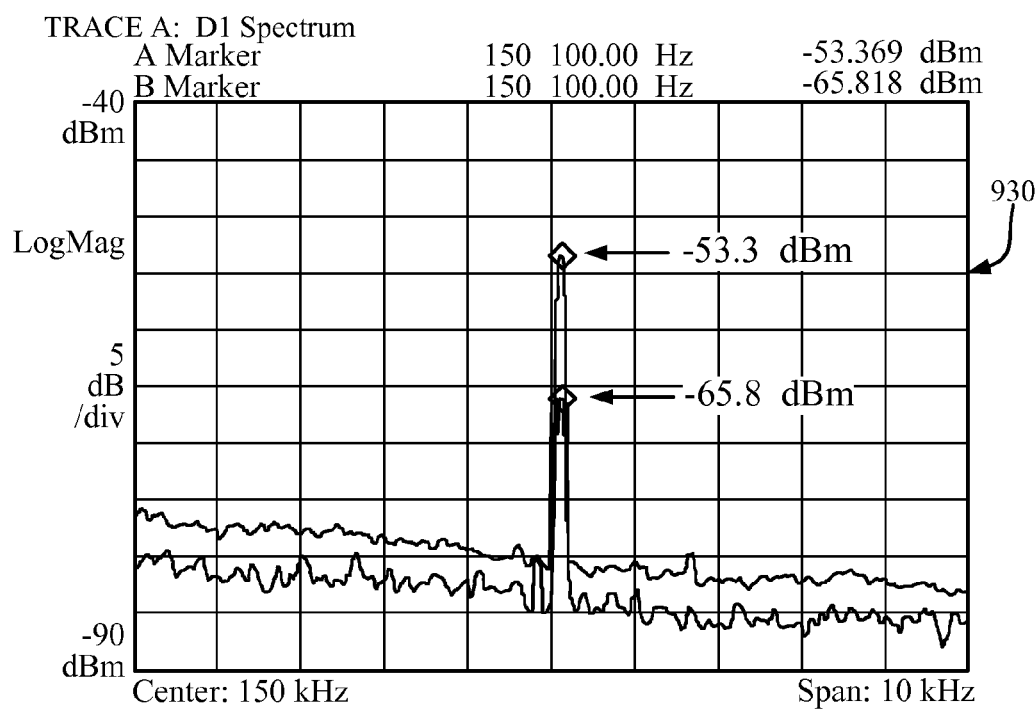
FIG. 12 illustrates a plot of measured TB with and without cancellation path in APD LNA.

The TB performance of the proposed receiver is shown in FIG. 12. Two Tx tones with −31 dBm each at 45 MHz offset and a jammer at 1 MHz offset with −30 dBm of power are applied. With the APD cancellation path on, the TB tone is at −65.8 dBm, which implies 77.8 dB of TB performance. With the APD cancellation path off, the TB is 65.3 dB. This difference between cancellation ON and OFF implies two important facts. First, the APD method improves the TB by 12.5 dB. Second, the TB variation with cancellation ON and OFF means the mixer does not contribute to any TB, otherwise the TB would not vary with the cancellation being turned ON and OFF, since it would be dominated by the mixer. Therefore, the additional rejection provided by EFP mixer dramatically improves system linearity performance, which is now completely dominated by LNA performance.

Figure 13:
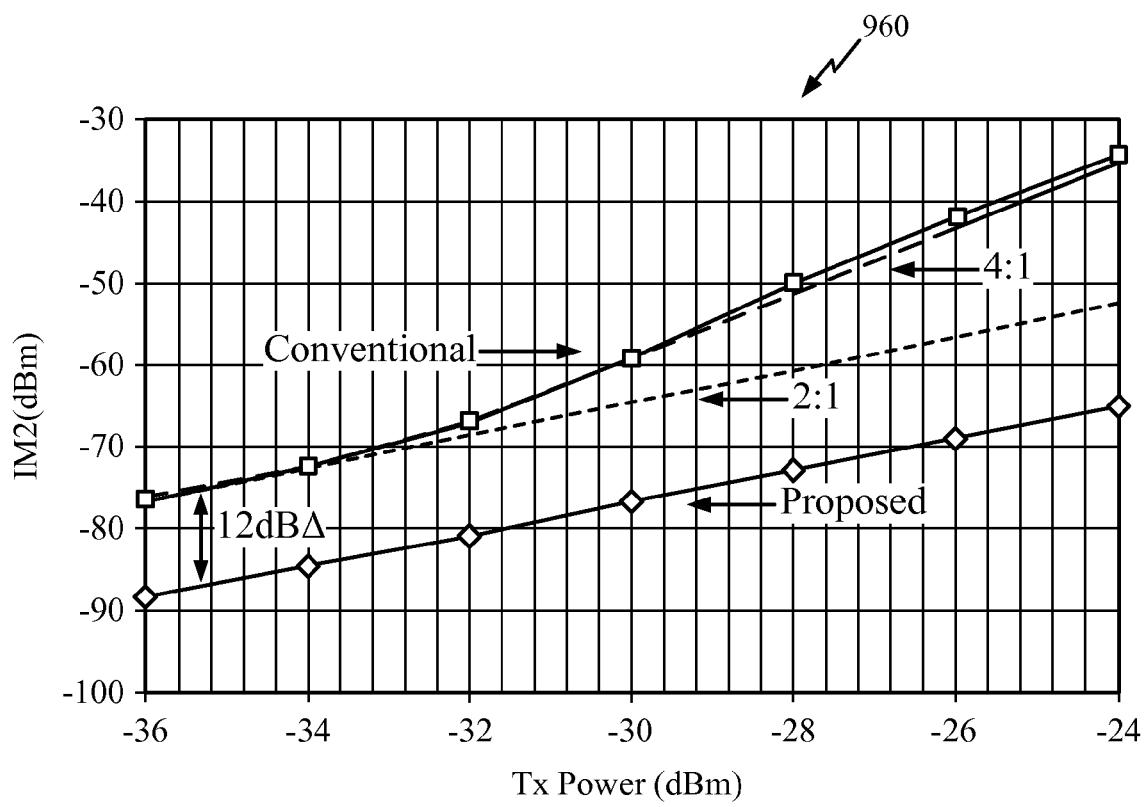
FIG. 13 illustrates a plot of measured $IIP_2$ performance comparison at Tx offset (45 MHz).

The measured $IIP_2$ performance at Tx offset is shown in FIG. 13. The conventional passive Mixer starts showing a 4-to-1 nonlinearity, which is strong nonlinear behavior, from −30 dBm. On the other hand, the proposed EFP mixer starts showing strongly nonlinear behavior above −24 dBm of power. The $IIP_2$ performance with EFP mixer is +60 dBm and +50 dBm with the conventional passive mixer. The conventional mixer exhibits strongly (4:1) nonlinear behavior at −30 dBm, which is a key power level in the specification. As a result, the $IIP_2$ performance of the conventional is further degraded by 2 dB.

TABLE 1

Receiver Performance Comparison

|  | Proposed Rx | Conventional Rx |
|---|---|---|
| Vdd | 2.1 V | 2.1 V |
| Idd | 18 mA/17 mA* | 18 mA/17 mA |
| VSWR | <2:1 | <2:1 |
| Voltage Gain | 42/44 dB | 44/46 |
| Noise Figure | 2.4/3.4 dB | 2.0/2.8 dB |
| IIP2 at 45 MHz | +60/+65 dBm | +50/+55 dBm |
| Triple Beat | +77.8/+65.3 dB | +47/+47 dB |
| Tx Rejection | 37 dB | 22 dB |

*Cancellation ON/OFF

The overall performance comparison is depicted in TABLE 1. Each receiver is measured with the APD cancellation ON and OFF. The Tx $TIP_2$ performance is important when there is no jammer present. The APD cancellation path can be turned OFF with this situation. The cancellation path needs to be ON only when the jammer is present. The EFP mixer has less gain and higher NF than a conventional mixer due to additional loss in the second set of switches.

The total power consumption for signal path is 18 mA, 14 mA for APD LNA and 4 mA for I/Q TIAs. The chip is fabricated in 0.18 μm CMOS process with 5 metals and 1 poly (5M1P). The total area is 2.25 mm2 including all the related pads and ESD circuitries.

It should be appreciated with the benefit of the present disclosure that a switched current mixer (SCM) with integral passive filtering can have applications such as RF filters used with radio frequency tuners, such as tunable tracking filters used in broadband receivers such as television and cable tuners.

Figure 14:
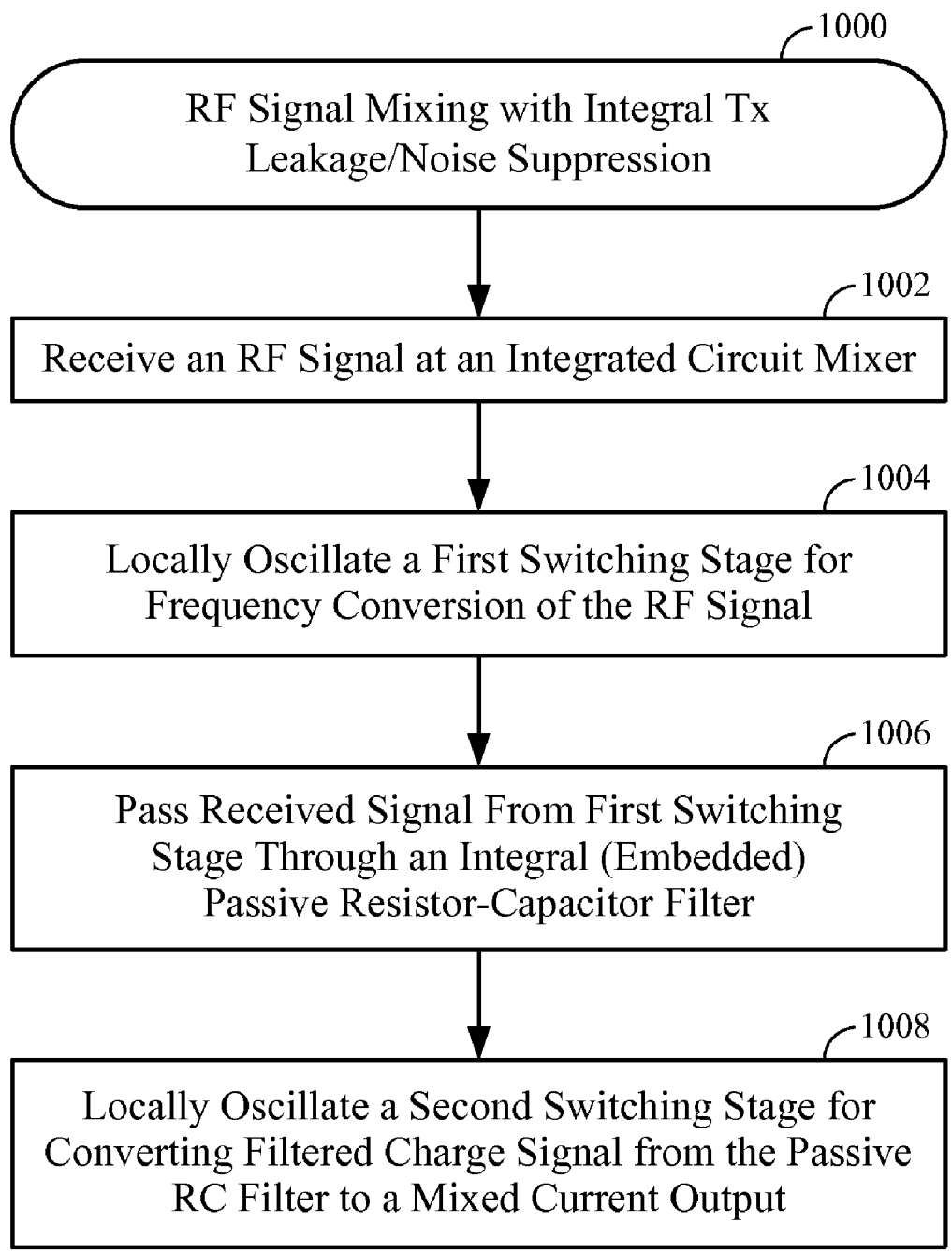
FIG. 14 illustrates a methodology for RF signal mixing with integral Tx leakage/noise suppression.

FIG. 14 illustrates methodologies and/or flow diagrams in accordance with the claimed subject matter. For simplicity of explanation, the methodologies are depicted and described as a series of acts. It is to be understood and appreciated that the subject innovation is not limited by the acts illustrated and/or by the order of acts. For example acts can occur in various orders and/or concurrently, and with other acts not presented and described herein. Furthermore, not all illustrated acts may be required to implement the methodologies in accordance with the claimed subject matter. In addition, those skilled in the art will understand and appreciate that the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device, carrier, or media.

In FIG. 14, a methodology 100 is depicted for RF signal mixing with integral Tx leakage/noise suppresion. In block 1002, the RF signal is received at an integrated circuit mixer having integral, embedded passive filtering. In block 1004, a first switching stage is locally oscillated to perform a frequency conversion of the received RF signal. The intermediate result of a charge signal passes through the embedded passive filtering section formed from Resistor-Capacitor circuitry in block 1006 to reduce received Tx leakage by lowpass filtering in the case of a receiver channel or to notch filter at the Rx band for a Tx channel. In block 1008, a second switching stage is locally oscillated to convert the filtered charge signal from the passive filter to a mixed current output that does not require external filtering components (e.g., SAW fiter).

What has been described above includes examples of the various aspects. It is, of course, not possible to describe every conceivable combination of components or methodologies for purposes of describing the various aspects, but one of ordinary skill in the art may recognize that many further combinations and permutations are possible. Accordingly, the subject specification intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects. In this regard, it will also be recognized that the various aspects include a system as well as a computer-readable medium having computer-executable instructions for performing the acts and/or events of the various methods.

In addition, while a particular feature may have been disclosed with respect to only one of several implementations, such feature may be combined with one or more other features of the other implementations as may be desired and advantageous for any given or particular application. To the extent that the terms "includes," and "including" and variants thereof are used in either the detailed description or the claims, these terms are intended to be inclusive in a manner similar to the term "comprising." Furthermore, the term "or" as used in either the detailed description of the claims is meant to be a "non-exclusive or".

It should be appreciated that any patent, publication, or other disclosure material, in whole or in part, that is said to be incorporated by reference herein is incorporated herein only to the extent that the incorporated material does not conflict with existing definitions, statements, or other disclosure material set forth in this disclosure. As such, and to the extent necessary, the disclosure as explicitly set forth herein supersedes any conflicting material incorporated herein by reference. Any material, or portion thereof, that is said to be incorporated by reference herein, but which conflicts with existing definitions, statements, or other disclosure material set forth herein, will only be incorporated to the extent that no conflict arises between that incorporated material and the existing disclosure material.

What is claimed is:

1. An integrated circuit for highly linear mixing of a radio frequency (RF) signal in a mixer circuitry, the mixer circuitry comprising:
   a local oscillator that outputs a local oscillator signal;
   a first switching stage switched by the local oscillator signal for frequency converting an RF signal;
   passive filter circuitry electrically connected to an output of the first switching stage; and
   a second switching stage switched by the local oscillator signal and electrically connected to an output of the passive filter circuitry to convert charge into a current signal.

2. The integrated circuit of claim 1, further comprising an Active Post-Distortion Low Noise Amplifier (APD LNA) electrically connected to receive the RF signal for amplification before the mixer circuitry, wherein the mixer circuitry and APD LNA form part of a receiver.

3. The integrated circuit of claim 1, wherein the passive filter circuitry further comprises a low pass filter.

4. The integrated circuit of claim 3, further comprising a transimpedance amplifier electrically connected to outputs of the mixer circuitry.

5. An integrated circuit for highly linear mixing of a radio frequency (RF) signal in a mixer circuitry, the mixer circuitry comprising:
   a local oscillator;
   a first switching stage switched by the local oscillator for frequency converting an RF signal;
   passive filter circuitry electrically connected to an output of the first switching stage;
   a second switching stage switched by the local oscillator and electrically connected to an output of the passive filter circuitry to convert charge into a current signal, wherein the passive filter circuitry further comprises a low pass filter; and
   a plurality of mixer circuitry, each tuned to a separate discrete channel for separately tuning an RF multichannel media communication signal.

6. The integrated circuit of claim 5, further comprising:
   a digital-to-analog converter (DAC) for converting a received digital signal into an analog signal;
   a baseband filter electrically connected to the DAC and electrically connected to the mixer circuitry; and
   a power amplifier electrically connected to the mixer circuitry for amplifying an output from the mixer circuitry for transmission, wherein the passive filter circuitry of the mixer circuitry comprises a notch filter at a receiver (RX) band.

7. A method for highly linear mixing of a radio frequency (RF) signal, comprising:
   receiving an RF signal at an integrated circuit mixer;
   locally oscillating a first switching stage to perform frequency conversion of the RF signal and to output a frequency converted signal;
   passing the frequency converted signal through an integral passive filter to suppress a noise component and to output a passively filtered signal; and
   passing the passively filtered signal through a locally oscillated second switching stage to output a mixed signal.

8. The method of claim 7, wherein the passing of the frequency converted signal through the integral passive filter involves passing the frequency converted signal through a low pass integral passive filter to suppress transmitter leakage.

9. The method of claim 7, wherein the passing of the frequency converted signal through the integral passive filter involves passing the frequency converted signal through a notch integral passive filter to suppress transmitter noise at a receiver band for transmission of a signal after mixing.

10. A method for highly linear mixing of a radio frequency (RF) signal, comprising:
    receiving an RF signal at an integrated circuit mixer;
    locally oscillating a first switching stage to perform frequency conversion of the RF signal and to output a frequency converted signal;
    passing the frequency converted signal through an integral passive filter to suppress a noise component and to output a passively filtered signal; and
    passing the passively filtered signal through a locally oscillated second switching stage to output a mixed signal, wherein the passing of the frequency converted signal through the integral passive filter involves passing the frequency converted signal through a low pass integral passive filter to suppress transmitter leakage, wherein the integrated circuit mixer is one of a plurality of integrated circuit mixers of a tuner, and wherein each integrated circuit mixer of the plurality of integrated circuit mixers is tuned to a unique and discrete channel of the RF signal.

11. An apparatus for highly linear mixing of a radio frequency (RF) signal, comprising:
    means for receiving an RF signal at an integrated circuit mixer;
    means for locally oscillating a first switching stage to perform frequency conversion of the RF signal thereby generating a frequency converted signal;
    means for passing the frequency converted signal through an integral passive filter to suppress a noise component thereby generating a passively filtered signal; and
    means for passing the passively filtered signal through a locally oscillated second switching stage to output a mixed signal.

12. The apparatus of claim 11, wherein the means for passing the frequency converted signal through the integral passive filter is also for suppressing transmitter leakage.

13. The apparatus of claim 11, wherein the means for passing the frequency converted signal through the integral passive filter is also for suppressing transmitter noise at a receiver band for transmission of a signal after mixing.

14. An apparatus for highly linear mixing of a radio frequency (RF) signal, comprising:
    means for receiving an RF signal at an integrated circuit mixer;
    means for locally oscillating a first switching stage to perform frequency conversion of the RF signal thereby generating a frequency converted signal;
    means for passing the frequency converted signal through an integral passive filter to suppress a noise component thereby generating a passively filtered signal; and
    means for passing the passively filtered signal through a locally oscillated second switching stage to output a mixed signal, wherein the means for passing the frequency converted signal through the integral passive filter is also for suppressing transmitter leakage, wherein the means for locally oscillating the first switching stage is part of a tuner, and wherein the integrated circuit mixer is tuned to a unique and discrete channel of the RF signal.

15. An integrated circuit comprising:
an Embedded Filtering Passive (EFP) mixer circuit comprising:
  a first mixer input signal node;
  a second mixer input signal node;
  a first mixer output signal node;
  a second mixer output signal node;
  a first switching stage having a first input coupled to the first mixer input signal node, a second input coupled to the second mixer input signal node, a first output, a second output, a third output, and a fourth output;
  a passive filter having a first input coupled to the first output of the first switching stage, a second input coupled to the second output of the first switching stage, a third input coupled to the third output of the first switching stage, and a fourth input coupled to the fourth output of the first switching stage, a first output, a second output, a third output, and a fourth output; and
  a second switching stage having a first input coupled to the first output of the passive filter, having a second input coupled to the second output of the passive filter, having a third input coupled to the third output of the passive filter, having a fourth input coupled to the fourth output of the passive filter, a first output coupled to the first mixer output signal node, and a second output coupled to the second mixer output signal node.

16. The integrated circuit of claim 15, wherein the first switching stage is coupled to receive a local oscillator signal, and wherein the second switching stage is coupled to receive the local oscillator signal.

17. The integrated circuit of claim 16, wherein the passive filter comprises:
  a first resistor coupled between a node A+ and the first output of the first switching stage;
  a second resistor coupled between a node B+ and the second output of the first switching stage;
  a third resistor coupled between a node B− and the third output of the first switching stage;
  a fourth resistor coupled between a node A− and the fourth output of the first switching stage;
  a fifth resistor coupled between the node A+ and the first input of the second switching stage;
  a sixth resistor coupled between the node B+ and the second input of the second switching stage;
  a seventh resistor coupled between the node B− and the third input of the second switching stage;
  an eighth resistor coupled between the node A− and the fourth input of the second switching stage;
  a first capacitor coupled between the node A+ and the node A−; and
  a second capacitor between the node B+ and the node B−.

18. The integrated circuit of claim 16, wherein the first switching stage comprises:
  a first transistor coupled between the first mixer input signal node and the first output of the first switching stage;
  a second transistor coupled between the first mixer input signal node and the second output of the first switching stage;
  a third transistor coupled between the second mixer input signal node and the third output of the first switching stage; and
  a fourth transistor coupled between the second mixer input signal node and the fourth output of the first switching stage.

19. The integrated circuit of claim 16, wherein the second switching stage comprises:
  a first transistor coupled between the first input of the second switching stage and the first output of the second switching stage;
  a second transistor coupled between the second input of the second switching stage and the second output of the second switching stage;
  a third transistor coupled between the third input of the second switching stage and the first output of the second switching stage; and
  a fourth transistor coupled between the fourth input of the second switching stage and the second output of the second switching stage.

20. The integrated circuit of claim 16, wherein the EFP mixer circuit further comprises:
  a transimpedance amplifier having a first input coupled to the first mixer output signal node, a second input coupled to the second mixer output signal node, a first output, and a second output.

21. The integrated circuit of claim 16, wherein the first switching stage is a frequency conversion stage, and wherein the second switching stage is a current switching stage.

22. The integrated circuit of claim 15, wherein the passive filter is a series Resistor-Capacitor (RC) filter.

23. The integrated circuit of claim 15, wherein the passive filter is a low pass filter.

24. The integrated circuit of claim 15, wherein the passive filter is a receive band notch filter.

25. The integrated circuit of claim 15, wherein the passive filter is a means for reducing received transmitter leakage.

26. The integrated circuit of claim 15, wherein the passive filter is a means for reducing receive band noise.

27. A method comprising:
  using a passive filter to filter a signal output by a first switching stage and thereby generating a passively filtered signal and supplying the passively filtered signal to a second switching stage;
  supplying a local oscillator signal to the first switching stage; and
  supplying the local oscillator signal to the second switching stage, wherein the first switching stage, the passive filter, and the second switching stage are parts of an Embedded Filtering Passive (EFP) mixer.

28. The method of claim 27, wherein the passive filter is a series Resistor-Capacitor (RC) filter.

* * * * *